(12) United States Patent
Gasworth

(10) Patent No.: US 8,997,687 B2
(45) Date of Patent: Apr. 7, 2015

(54) APPARATUS AND METHOD FOR PLASMA ARC COATING

(75) Inventor: Steven M. Gasworth, Novi, MI (US)

(73) Assignee: Exatec LLC, Wixom, MI (US)

( * ) Notice: Subject to any disclaimer, the term of this patent is extended or adjusted under 35 U.S.C. 154(b) by 1376 days.

(21) Appl. No.: 11/966,554

(22) Filed: Dec. 28, 2007

(65) Prior Publication Data

US 2008/0160205 A1    Jul. 3, 2008

Related U.S. Application Data

(60) Provisional application No. 60/882,320, filed on Dec. 28, 2006.

(51) Int. Cl.
| | | |
|---|---|---|
| *C23C 16/00* | (2006.01) | |
| *H05H 1/24* | (2006.01) | |
| *C23C 16/455* | (2006.01) | |
| *C23C 16/513* | (2006.01) | |
| *C23C 16/52* | (2006.01) | |
| *C23C 16/54* | (2006.01) | |
| *H01J 37/32* | (2006.01) | |
| *H05H 1/42* | (2006.01) | |

(52) U.S. Cl.
CPC ............... *H05H 1/24* (2013.01); *C23C 16/455* (2013.01); *C23C 16/45561* (2013.01); *C23C 16/513* (2013.01); *C23C 16/52* (2013.01); *C23C 16/54* (2013.01); *H01J 37/32376* (2013.01); *H05H 1/42* (2013.01)

(58) Field of Classification Search
USPC .................................... 118/715, 722, 723 R
See application file for complete search history.

(56) References Cited

U.S. PATENT DOCUMENTS

| | | | |
|---|---|---|---|
| 4,492,181 A * | 1/1985 | Ovshinsky et al. ............ | 118/718 |
| 4,761,269 A * | 8/1988 | Conger et al. ................. | 118/679 |
| 5,047,612 A | 9/1991 | Savkar et al. | |
| 5,239,161 A | 8/1993 | Lang | |
| 6,217,658 B1 * | 4/2001 | Orczyk et al. ................. | 118/697 |
| 6,258,171 B1 * | 7/2001 | Agarwal ........................ | 118/715 |
| 6,397,776 B1 | 6/2002 | Yang et al. | |
| 6,872,428 B2 | 3/2005 | Yang et al. | |
| 6,948,448 B2 | 9/2005 | Schaepkens | |
| 7,112,352 B2 | 9/2006 | Schaepkens | |
| 2001/0022295 A1 | 9/2001 | Hwang | |

(Continued)

FOREIGN PATENT DOCUMENTS

| | | |
|---|---|---|
| WO | WO 2004/076716 A1 | 9/2004 |
| WO | WO 2005/087977 A1 | 9/2005 |

OTHER PUBLICATIONS

International Search Report—PCT/US2007/089084 (Jun. 5, 2008).

(Continued)

*Primary Examiner* — Maureen Gramaglia
(74) *Attorney, Agent, or Firm* — Cantor Colburn LLP

(57) ABSTRACT

A system for coating a side surface of a moving substrate. The system includes an array of plasma sources, a first plurality of orifices located upstream of the array and a second plurality of orifices located downstream of the array. A coating reagent is injected from each orifice into a plasma jet issuing from plasma source associated with that orifice. A controller modulates the flow of coating reagent and the flow flush gas to the orifices according to the contours of the substrate and to the position of the substrate relative to the array. An additional plasma array and set of orifices may be employed to coat the opposite side surface of the substrate.

19 Claims, 5 Drawing Sheets

(56) References Cited

U.S. PATENT DOCUMENTS

| | | |
|---|---|---|
| 2003/0097988 A1 | 5/2003 | Schaepkens |
| 2003/0099784 A1 | 5/2003 | Schaepkens |
| 2004/0200417 A1 | 10/2004 | Hanawa et al. |
| 2004/0216665 A1* | 11/2004 | Soininen et al. ............ 118/715 |
| 2005/0202184 A1 | 9/2005 | Iacovangelo et al. |
| 2006/0019494 A1* | 1/2006 | Cao et al. .................... 438/680 |
| 2006/0029746 A1 | 2/2006 | Gasworth |
| 2006/0121211 A1* | 6/2006 | Choi ............................ 427/569 |
| 2006/0156983 A1 | 7/2006 | Penelon et al. |

OTHER PUBLICATIONS

High-rate deposition of abrasion resistant coatings using a dual-source expanding thermal plasma reactor, M. Schaepkens, S. Selezneva, P. Moeleker, and C.D. Iacovangelo, Jul. 1, 2003, pp. 1266-1271, J. Vac. Sci. Technol. A 21(4) Jul./Aug. 2003.

\* cited by examiner

APPARATUS AND METHOD FOR PLASMA ARC COATING

CROSS REFERENCE TO RELATED APPLICATION

This application is a non-provisional application claiming the benefit of provisional application 60/882,320 filed Dec. 28, 2006, the entire contents of which are herein incorporated by reference.

BACKGROUND

The present invention generally relates to a system and method for coating substrates. More specifically, the invention relates to a plasma coating system and method whereby the introduction of reagents is controlled to enhance the coating formed on the substrate and conserve the amount of reagents used in forming the coating.

Generally, plasma coating systems, to which the present invention is applicable, include various stations or zones connected in sequence and through which substrates are moved in a continuous series. These stations may include a load lock, a heating station, one or more coating stations and an exit lock. In the coating station(s) is one or more plasma sources, such as an expanding thermal plasma (ETP) source, and an associated reagent manifold(s) for injecting the reagent. During the coating process, the substrates are moved past the plasma source(s) as a coating reagent(s) is injected into the plasma jet issuing from the plasma source. As the substrates are moved through the resulting plasma plume, the coating is deposited on the surfaces of the substrates.

Typically, coating stations continuously supply reagents during the coating process. This generally results in overspray, excessive coating build-up and excessive use and wastage of the reagents.

Moreover, in certain systems, plasma sources are located on opposing sides of the coating station to enable the coating of both sides of the substrate. In such a coating station, the balancing of the opposing plasma plumes, so as to minimize or prevent overspray, is difficult to achieve and generally cannot be consistently maintained during production runs. As a result, opposing plasma plumes may mix when the plumes are not fully intercepted by a substrate. This may further result in specific precursors condensing on an unintended side of the substrate, for example, on the side of the substrate that does not directly oppose the plasma source that generated the plasma plume carrying that specific precursor.

SUMMARY

Generally, the present invention is related to an in-line, continuous plasma coating system for coating substrates. In such a system, a series of substrates is continuously passed through the coating station in a sequential, in other words, single file, order. The plasma coating system includes an array of plasma sources (plasma array), a plurality of manifolds located upstream of the plasma array, and a plurality of manifolds located downstream of the plasma array. One or more coating reagents are ejected from orifices in the manifolds and into the plasma jet issuing from a plasma source of the plasma array. A controller modulates the flow of coating reagents and the flow of a flush gas through each manifold according to the shape of the substrate and/or according to the position of the substrate relative to the plasma sources. A second configuration of manifolds and plasma sources may also be employed and controlled to deposit a coating on a second side or opposing surface of the substrate.

Further features and advantages will become readily apparent to those skilled in the art from the following detailed description, claims and appended drawings.

DETAILED DESCRIPTION

Figure 1:
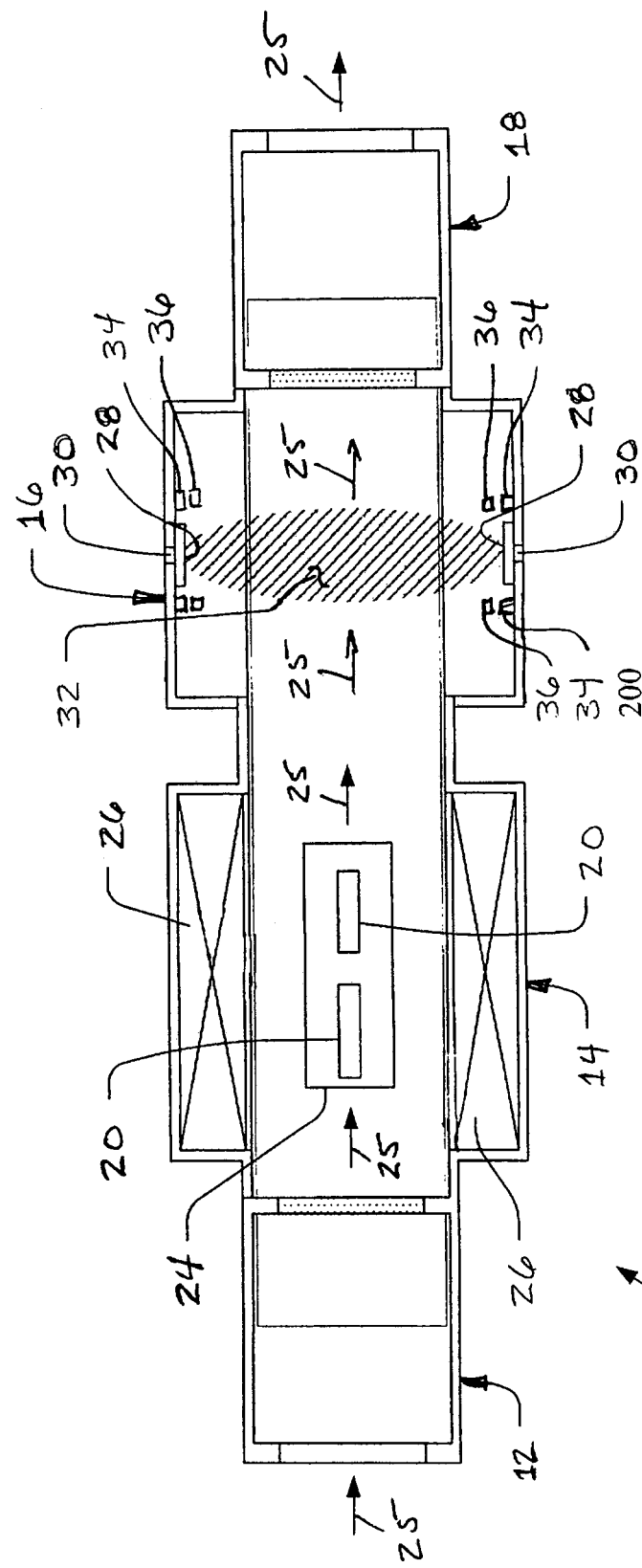
FIG. 1 is a schematic plan view of a system for coating substrates in accordance with the principles of the present invention.

Referring now to the drawings, a substrate coating system 10, in accordance with the principles of the present invention, is schematically shown in FIG. 1. The substrate coating system 10 includes various stations or zones, such as a load lock 12, a substrate heating zone 14, one or more substrate coating zones 16 and an exit lock 18, all of which are connected in series and in an airtight manner. As such, the various stations and zones may be evacuated by a plurality of vacuum pumps (not shown) to maintain a suitable vacuum pressure that is conducive to the coating process.

The substrate coating system 10 is preferably used to coat a plurality of substrates 20 (two substrates being shown) as the substrates 20 are continuously moved through the system 10.

As those skilled in the art will appreciate, the substrates themselves may be formed from a wide variety of materials. In an exemplary embodiment, the substrates 20 are made of a thermoplastic material. Such materials include, but are not limited to, polyvinylalcohol, polyvinylacetal, polyvinylacetate, polyethylene, polypropylene, polystyrene, polyamide, polyimide and polyvinylchloride. Other suitable materials for the substrates 20 include polycarbonate resins, polyestercarbonates, acrylic polymers, polyesters, polyurethanes, and the like. Further examples of materials from which the substrates 20 may be made of include ceramic, glass, metal or a semiconductor.

The substrates 20 may be formed by a variety of techniques, depending on their construction material. Such techniques include, without limitation, injection molding, cold forming, vacuum forming, extrusion, blow molding, transfer molding, compression molding, and thermal forming. Additionally, the substrates 20 may be curved, flat, rigid or flexible, in nature.

In utilizing the system 10, the substrates 20 are placed on a substrate carrier 24, which may be a rack, hanger or other device. Such devices are known in the industry and, therefore, are not further described herein. The substrate carrier 24 enters the load lock 12 and, in the load lock 12 or prior thereto, is engaged by a conveyor, indicated by arrows 25, that transports the carrier 24 and substrates 20 through the coating system 10. Obviously, any mechanism suitable for transporting the carrier 24 and substrates 20 through the coating system 10 may be employed.

Once transferred into the substrate heating zone 14, the substrates 20 are heated to a temperature suitable for coating of the substrates 20. To achieve this, the substrate heating zone 14 includes heating units 26, two being shown. The heating units 26 are located within or outside of, at or along the side walls of the substrate heating zone 14 or where dictated by the overall design of the system 10. Various types of heating units 26 may be employed and include, but are not limited to, infrared heaters, microwave heaters, resistance heaters, non-reactive plasma plumes and the like.

After traveling through the substrate heating zone 14, the substrate carrier 24 enters the substrate coating zone 16, where a coating is deposited on the substrates 20. Once the substrates 20 have been coated, they are then transferred to the exit lock 18, where they are released from the coating system 10.

While a variety of coating methodologies and procedures may be employed with the present invention, as illustrated, the substrate coating zone 16 includes one or more expanding thermal plasma (ETP) source arrays 28, which may be arranged in pairs opposite one another in the coating zone 16. The ETP source arrays 28 are mounted on their own ports 30 or to a common manifold located on the side walls of the substrate coating zone 16.

Each of the ETP source arrays 28 is preferably fed with an inert gas that is heated, partially ionized and which issues from the array 28 as a plasma jet, which is illustrated in FIG. 1 as a combined or common plasma plume 32 from opposed arrays 28, into the substrate coating zone 16. Examples of inert gases that may be utilized with the coating system 10 include, but are not limited to, argon, helium, neon and the like.

A coating reagent and an oxidizing gas are injected from reagent and gas injection manifolds 34, 36, respectively. The oxidizing gas and coating reagent, injected in vapor form at a controlled rate, diffuse into the plasma jet, which expands into the substrate coating zone 16 and is directed towards the substrates 20 being conveyed therethrough. Examples of oxidizing gases include, but are not limited to, oxygen and nitrous oxide, or any combination thereof. Examples of coating reagents include, but are not limited to, organosilicons such as decamethylcyclopentasiloxane (D5), vinyltrimethylsilane (VTMS), dimethyldimethoxysilane (DMDMS), octamethylcyclotetrasiloxane (D4), tetramethyldisiloxane (TMDSO), tetramethyltetravinylcyclotetrasiloxane (V-D4), hexamethyldisiloxane (HMDSO) and the like.

Figure 2A:
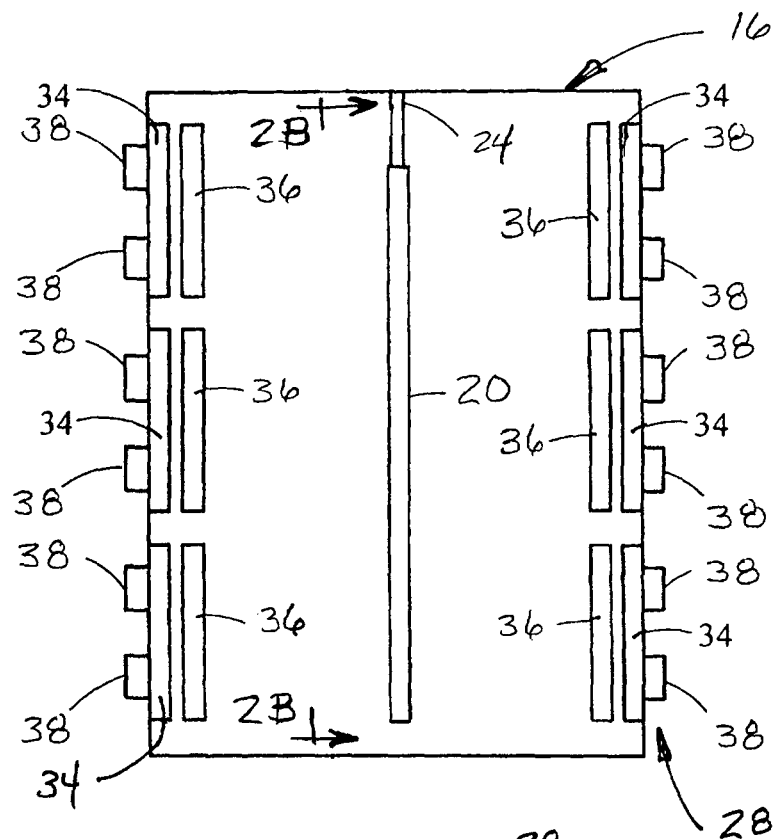
FIG. 2A is a schematic depiction of an end-view through the coating station of the system of FIG. 1.
Figure 2B:
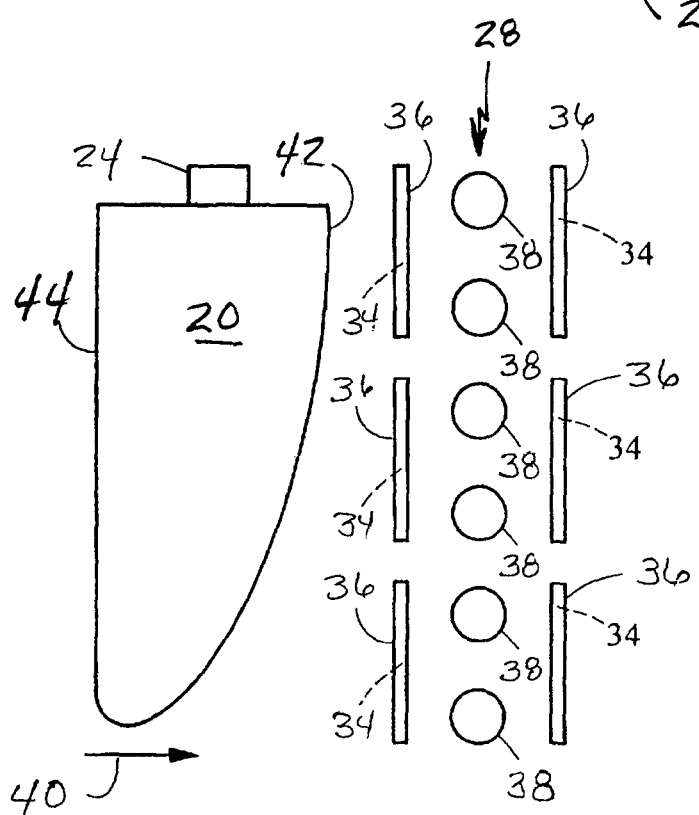
FIG. 2B is a schematic side-view of the coating station seen in FIG. 2A and as generally taken along line 2B-2B.

Referring now to FIG. 2A and FIG. 2B, various configurations of the system 10 involve impinging an activated reagent, or, in some implementations, activated reagents, on one or both sides of a substrate 20 as it advances through the coating zone 16. The substrate 20, which can be in the form of a window, a roof panel or other component of a vehicle, is preferably made of polycarbonate and the heating units 26 ensure that the substrate 20 is at the appropriate temperature before entering the coating zone 16. If needed, additional heaters may be used in the coating zone 16 make up for any heat loss during transit before entering the coating zone 16.

The system 10 according to the present invention minimizes extraneous coating material on the vacuum chamber walls of the coating zone 16 when there are gaps between successive substrates, which occurs when the adjacent trailing and leading edges of successive substrates 20 do not nest with one another because of their different contours or because the substrate conveyor system provides for independent motion or articulation of substrates to accommodate complex shapes or to accommodate a combination of a stationary heating step with a scanning coating step.

The coating zone 16 is a vacuum chamber with a plurality of plasma sources 38 (six being illustrated as a non-limiting example) on each side of the coating zone 16. The manifold segments 34, 36 may further be delineated as either an upstream or downstream manifold segment; the terms upstream and downstream being referenced to the location of the manifold segment relative to the plasma sources 38 and the direction of movement (designated by the arrow 40 seen in FIG. 2B) of the substrates 20. Each manifold segment 34, 36 is associated with one or more plasma sources 38. As such, each side of the coating zone 16 illustrated in FIG. 2B is provided with three upstream coating reagent and oxidizing gas manifold segments 34, 36 and three downstream coating reagent and oxidizing gas manifold segments 34, 36. The various manifold segments 34 of the coating zone 16 inject coating reagents therethrough independently of one another. Similarly, a simple control mechanism can be employed to switch the oxidizing gas manifold segments 36 on and off individually or in various combinations of two or more manifold segments 36.

As shown in FIG. 2B, the leading edge 42 of an advancing substrate 20 first passes the upstream manifold segments 34, 36, then the ETP plasma array 28 and its individual plasma sources 38, and finally the downstream manifold segments 34, 36. Accordingly, the trailing edge 44 is the last portion of the substrate 20 to pass by the downstream manifold segments 34, 36.

Figure 3:
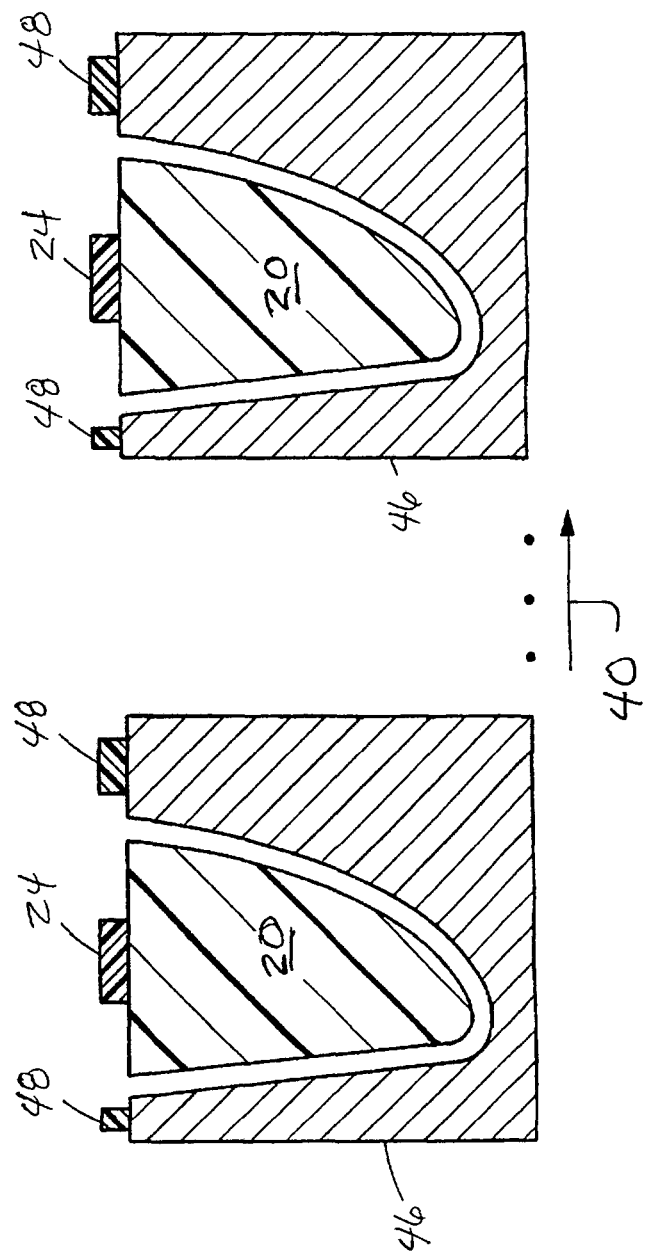
FIG. 3 illustrates substrates with associated space fillers that may be optionally employed as the substrates are advanced through the system of FIG. 1.

In certain implementations of the present invention, as seen in FIG. 3, a filler 46 is also attached to the carrier and/or conveyor 25 by a set of tabs 48. The filler 46 is closely spaced to the substrate 20 such that it is a virtual extension of the edge of the substrate 20. The filler 46 is a disposable or re-useable part, made from, for example, polycarbonate or aluminum, that forms a close border around the substrate 20. In such a configuration, the filler 46 acts a collector of extraneous heat and coating material. Thus, the filler promotes uniform temperature and coating thickness over the substrate 20. In particular embodiments, the temperature over the substrate 20 is about 65° C.±10° C. at the entrance of the coating zone 16, the coating thickness is between about 2 µm to 3 µm after the coating zone 16, and the conveyor 25 moves the substrates 20 through the system 10 at a speed of about 2.5 cm/s. As noted previously, the continuous flow of the coating reagents through the manifolds results in wastage of material between the substrates. Moreover, that continuous flow creates extra cleaning and maintenance burdens with regard to the system 10.

Various embodiments of the system 10 are able to reduce the tendency for a relatively thick plasma coating at the edges of the substrate, where greater coating thicknesses tend to occur relative to the center of the substrate 20 when there is a large gap between successive substrates 20 (or between a substrate 20 and a filler 46). Since there is a preferred range for the coating thickness, it is desirable to minimize thickness variability across the substrate so as to make the coating process more robust. Too thin of a coating may compromise abrasion resistance. A relatively thick coating at the edges is a probable contributing factor to less robust water immersion performance at the edges of the substrates 20.

Figure 4:
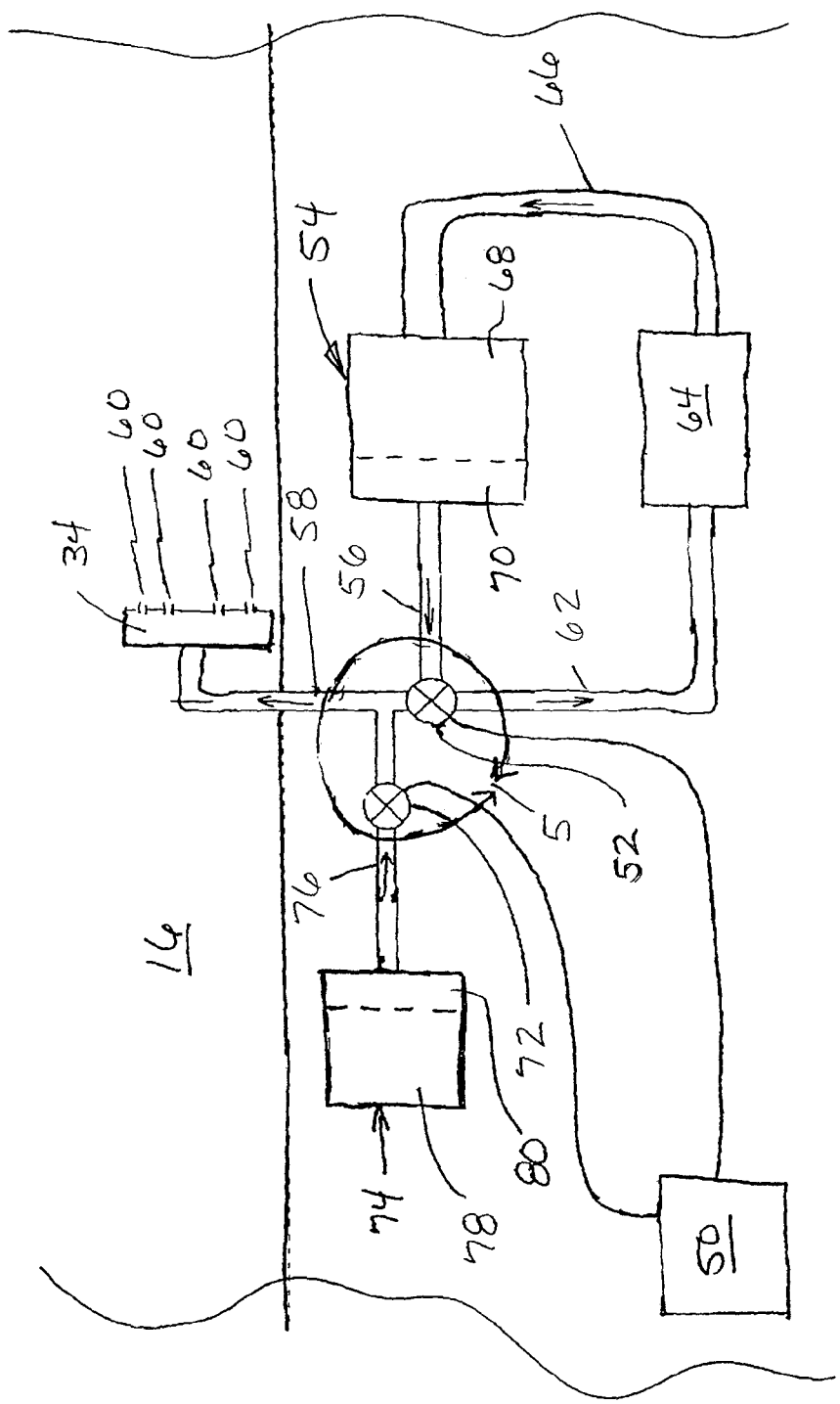
FIG. 4 illustrates a coating reagent manifold supply assembly for the coating station seen in FIGS. 2A and 2B.

Referring to FIG. 4, the system 10 further includes a controller 50 that directs the upstream and downstream manifold segments 34, such that the manifold segments 34 can operate independently of one another and in accordance with the profile of the leading and trailing edges 42, 44 of the substrate 20 passing there in the front of it.

The controller 50 modulates the flow of the coating reagent to the individual manifold segments 34 according to the position of the substrates leading and trailing edges 42, 44 relative to a particular one of the manifold segments 34. Specifically, the controller 50 operates a 3-way valve 52, one of which is associated with each manifold segment 34. The valve 52 directs the coating reagent from a metered coating reagent source 54 to the respective coating reagent manifold segments 34 via conduits 56, 58. The metered coating reagent source 54, which is shared by multiple manifold segments 34, provides the coating reagent in vapor form and in doing so utilizes a pressurized coating reagent source 68 and a vapor mass flow controller 70. Alternatively, the valve 52 diverts the coating reagent away from the associated coating reagent manifold segment 34. This control of the valve 52 provides for modulation of the flow of coating reagent to the manifold segments 34 and their associated ejection orifices 60, all while the flow of coating reagent from the metered coating reagent source 54 continues uninterrupted. The diverted flow of coating reagent may be directed, via a conduit 62, into a relatively cool condensing vessel 64, which can also be shared by multiple valves 52 and coating reagent manifold segments 34. The condensing vessel 64 condenses the vapor form of the coating reagent and this condensed coating reagent can be optionally recycled back into the metered coating reagent source 54 via an optional conduit 66. In short, the valve 52 modulates the flow of coating reagent to the respective individual coating reagent manifold segment 34 by directing the continuous flow of coating reagent from the metered coating reagent source 54 to a manifold segment 34 or the condensing vessel 64 for recycling.

After the valve 52 has been switched so as to divert the flow of coating reagent away from the manifold segment 34 and into the condensing vessel 64, it will be appreciated that residual vapor in the conduit 58 can continue to flow into the manifold segment 34. This, however, is undesirable since the residual flow of coating reagent vapor limits the effective speed of the system's response to the modulating of the flow of coating reagent. In other words, the valve 52 does not instantaneously stop coating reagent from entering the manifold segments 34. Another associated problem with the modulating of the flow of coating reagent into the coating zone 16 is that the sudden lack of coating reagent being provided to the coating zone 16 can cause a modulation of the gas load in the vacuum chamber of the coating zone 16 and can thereby cause an undesirable modulation of the pressure in the coating zone 16 during the coating process.

To alleviate both of the above anticipated problems, the system 10 of the present invention includes a second 3-way valve 72 associated with each coating reagent manifold segment 34. The valve 72 directs and controls the rate at which a flush gas, such as argon, oxygen or both, is delivered from a metered flush gas source 74 through a conduit 76 connected to conduit 58 downstream of the previously discussed valve 52. Like the metered coating reagent source 54, the metered source 74 includes a pressurized flush gas source 78 and a flush gas mass flow controller 80. Under direction of the controller 50, the opening of the valve 72 is controlled in conjunction with the operation of the valve 52 such that a flow of flush gas from the metered flush gas source 74 replaces the flow of coating reagent from the metered coating reagent source 54. Preferably, the flow of flush gas from the metered flush gas source 74 is approximately equal to the flow of the coating reagent from the metered coating reagent source 54 that it replaces. Since the controller 50 instructs the valve 72 to open when it instructs the valve 52 to divert the coating reagent to the condensing vessel 64, the undesirable problem of pressure fluctuation within the coating zone 16 is minimized. Additionally, providing such a flow of flush gas also clears residual coating reagent from the conduit 58 leading to the manifold segment 34, thereby minimizing the response time of the system. Preferably, the flush gas is of the above-mentioned variety since it does not produce a coating in the coating zone 16 in the absence of a coating reagent.

Figure 5A:
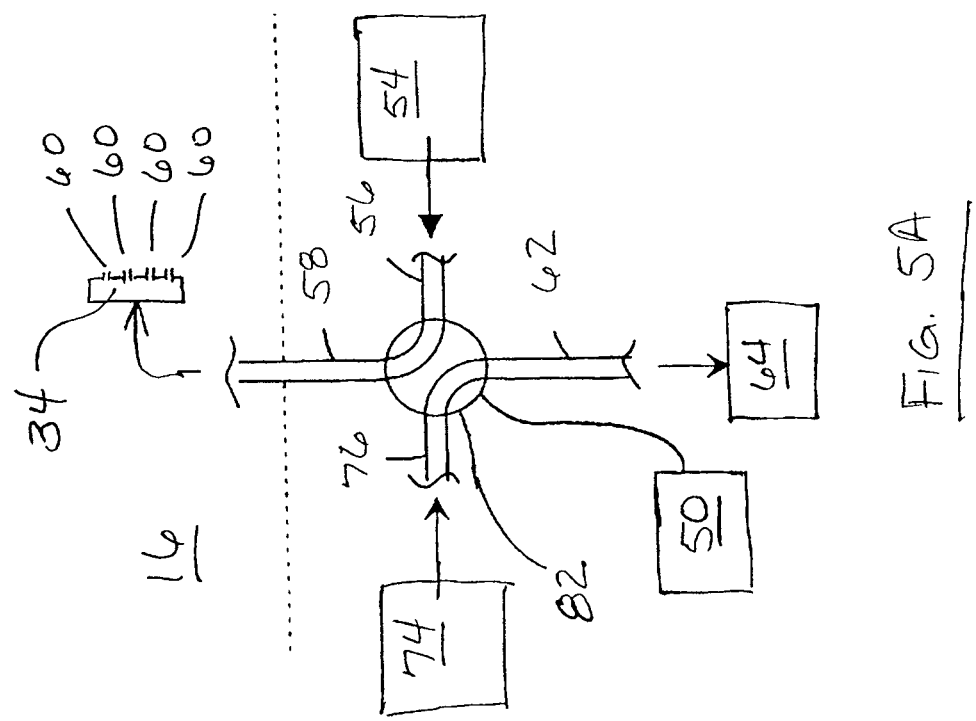
FIGS. 5A and 5B illustrate an alternative valve configuration for the configuration within circle 5 of the coating reagent manifold supply assembly seen in FIG. 4.
Figure 5B:
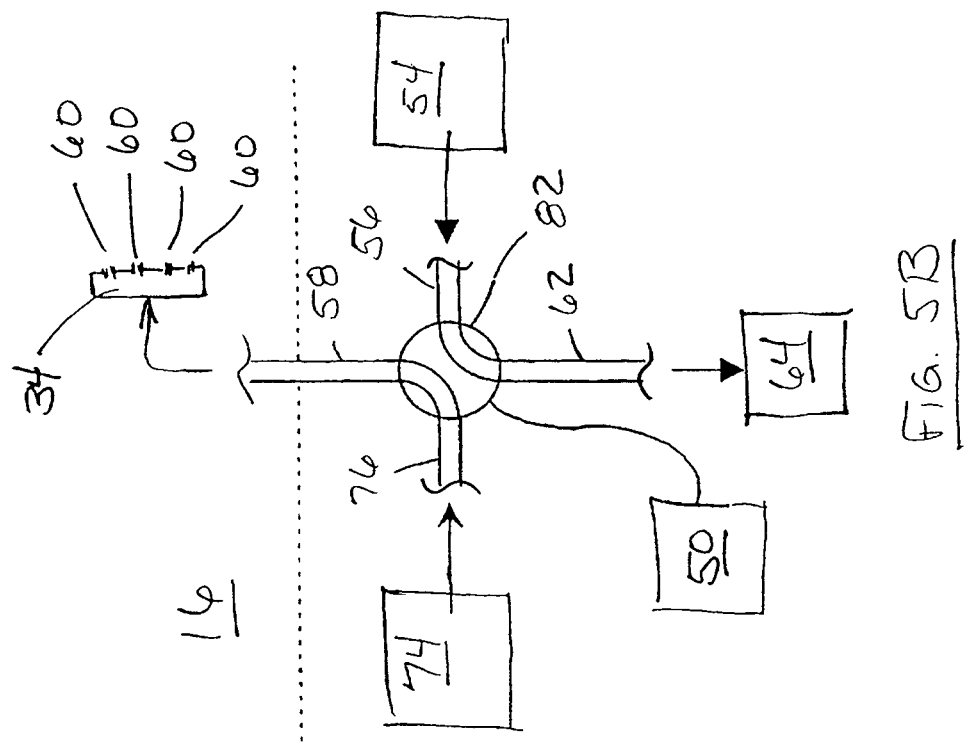

In an alternative embodiment, shown in FIGS. 5A and 5B, the three-way valve 52 and the shut-off valve 72 of the prior embodiment are replaced with a single, four-way valve 82. In this way, only one valve is associated with any coating reagent manifold segment 34. As shown in FIG. 5A, the controller 50 can position the four-way valve 82 to direct the coating reagent to the coating reagent manifold segment 34 and flush gas to the condensing vessel 64. To direct flush gas to the coating reagent manifold segment 34, the controller 50 instructs the four-way valve 82 to rotate, for example, a quarter of a turn (see FIG. 5B). Flush gas is then directed to the coating reagent manifold segment 34 while the coating reagent is directed to the condensing vessel 64.

As described previously, the flow rate of the flush gas from the metered flush gas source 74 is approximately equal to the flow rate of the coating reagent from the metered coating reagent source 54. Under the direction of the controller 50, the four-way valve 82 directs both the flow of the flush gas from the metered flush gas source 74 and the flow of the coating reagent from the metered coating reagent source 54. In either of the embodiments described above, at any instant, either flush gas or vaporized reagent is flowing to the coating reagent manifold segment at approximately the same rate. Hence, the pressure in the coating station is substantially constant, even as the flow of coating reagent is modulated. Moreover, the response time for stopping the flow of the coating reagent, at the coating reagent manifold segment, is shortened since the flush gas quickly displaces the residual vapor in the conduit 58 and in the coating reagent manifold segment 34 after the flow of coating reagent has been diverted to the condensing vessel 64. It is noted that the aforementioned conduits or valves may be heated if the reagent is a liquid at room temperature.

Although the metered coating reagent source 54, the condensing vessel 64, and the metered flush gas source 74 are described above as being shared by multiple coating reagent manifold segments 34, the metered coating reagent source 54, the condensing vessel 64, and the metered flush gas source 74 can be individually associated with a single manifold segment 34.

Thus, the system 10 reduces or minimizes excess coating at the edges of substrates by modulating the flow of reagent to the upstream and downstream manifolds, according to specific protocols, as a leading or trailing substrate edges 42, 44 cross in front of a respective array of plasma sources 38. The coating reagent is provided to a manifold 34 only when there is a substrate 20 present, thereby reducing the flux of coating precursors during edge coating and limiting the opportunity for coating precursors originating on one side of the coating zone 16 from depositing on the opposing side of the substrate 20. The optimum timing of the individual switching events, expressed in terms of a local edge position relative to the individual manifolds, can be determined empirically and need not be discussed herein. The desired timing can then be easily implemented, since it is only a matter of equipment design to provide for tracking of the position of the substrate 20 with sufficient accuracy and resolution.

Accordingly, the system 10 also minimizes extraneous coating formation on the walls of the coating zone 16, as well as on the optional fillers 46 if they are employed, because coating reagent is diverted to the condensing vessel 64 when there are large gaps between successive substrates 20. This has the effect of minimizing the frequency of chamber wall cleaning (and cleaning of fillers 46 if employed) and maximizing utilization of reagent. As mentioned previously, the system 10 improves the uniformity of plasma coating thickness, making the plasma coating process more robust with respect to upper and lower specification limits for coating thickness.

As shown in the illustrated embodiment, the manifolds are segmented to accommodate a variety of contours of substrate edges. With the source arrays 28 oriented transverse to the direction of substrate motion, different portions of a contoured substrate's edge generally pass the plasma source 38 at different times. Segmenting the coating reagent manifolds 34 provides for independent local flow switching among manifolds 34, according to a desired protocol. In other embodiments, rather than using manifold segments 34 with multiple orifices 60, individual orifices may be controlled according to the principles of this invention.

As a person skilled in the art will readily appreciate, the above description is meant as an illustration of implementation of the principles of this invention. This description is not intended to limit the scope or application of this invention in that the invention is susceptible to modification, variation, and change without departing from the spirit of the invention, as defined in the following claims.

What is claimed is:

1. A coating system for coating a substrate having opposing first and second side surfaces, the system comprising:
   a plasma source configured to issue a plasma jet toward the first side surface of the substrate;
   an orifice located generally adjacent to the plasma source;
   a coating reagent source coupled to the orifice and configured to provide a coating reagent thereto;
   a flush gas source coupled to the orifice and configured to provide a flush gas thereto;
   a controller configured to cease the flow of coating reagent to the orifice while directing flush gas to the orifice;
   a flush gas valve positioned in line between the flush gas source and the orifice, the flush gas valve also being coupled to the controller;
   wherein the flush gas valve is a shut-off valve; and
   wherein the flow of coating reagent from the coating reagent source continues uninterrupted when reagent flow to the orifice is suspended.

2. The system of claim 1 wherein the controller is configured to control the providing of coating reagent and flush gas to the orifices according to the position of a leading edge and a trailing edge of the substrate relative to the plasma source.

3. The system of claim 1 comprising a plurality of orifices wherein the plurality of orifices include upstream orifices and downstream orifices respectively located upstream and downstream of the plasma source relative to a substrate path along which the substrate is moved.

4. The system of claim 3 wherein the plurality of orifices includes at least two groups of orifices, each group of orifices being coupled to an associated manifold segment.

5. The system of claim 1 further comprising a coating reagent valve positioned in line between the coating reagent source and the orifice, the coating reagent valve being coupled to the controller.

6. The system of claim 5 wherein the controller is configured to modulate the flow of coating reagent from the coating reagent source and the flow of flush gas from the flush gas source by controlling operation of the coating reagent valve and of the flush gas valve.

7. The system of claim 5 wherein the coating reagent valve is a three-way valve.

8. The system of claim 7 where in the three-way valve is also coupled to a condensing reservoir.

9. The system of claim 1 further comprising a four-way valve located in line between the coating reagent source, the flush gas source and the orifice, the four-way valve being coupled to the controller and the controller being configured to modulate the flow of coating reagent and flush gas to the orifice by controlling the operation of the four-way valve.

10. The system of claim 9 where in the four-way valve is also coupled to a condensing reservoir.

11. The system of claim 1 wherein the coating reagent source includes a pressurized source of a coating reagent and a coating reagent metering device, and wherein the flush gas source includes a pressurized source of flush gas and a flush gas metering device.

12. The system of claim 1 further comprising a filler shaped to surround a substantial portion of the substrate as the substrate is moved through the system.

13. The system of claim 1 further comprising;
   a second plasma source configured to issue a second plasma jet toward the second side surface of the substrate;
   a second orifice located generally adjacent to the second plasma source;
   the coating reagent source being coupled to the second orifice and configured to provide the coating reagent thereto;
   the flush gas source being coupled to the second orifice and configured to provide the flush gas thereto; and
   the controller being configured to control the providing of the coating reagent and the flush gas to the second orifice
   wherein the controller is further configured to minimize pressure modulation in the coating zone.

14. The system of claim 13 comprising a plurality of second orifices wherein the plurality of second orifices include second upstream orifices and second downstream orifices respectively located upstream and downstream of the second plasma source relative to a substrate path along which the substrate is moved.

15. The system of claim 13 wherein the plurality of second orifices includes at least two second groups of second orifices, each second group being coupled to an associated manifold segment, the controller being configured to control the providing of the coating reagent and the flush gas to the second orifice.

16. The system of claim 1 wherein the controller is further configured to control a pressure modulation in a coating zone.

17. The system of claim 1 wherein the controller is further configured to instruct the flush gas valve to open approximately when it instructs another valve controlling reagent gas flow to close.

18. The system of claim 1 wherein the controller is configured to direct the flow of coating reagent away from the orifice.

19. A coating system for coating a substrate, comprising:
   a plasma source configured to issue a plasma jet toward the substrate;
   an orifice located generally adjacent to the plasma source in a coating zone;
   a coating reagent source configured to provide a coating reagent to the coating zone through the orifice;

a flush gas source configured to provide a flush gas to the coating zone through the same orifice as the coating reagent;

a flush gas valve positioned in line between the flush gas source and the orifice; and a controller configured to instruct the flush gas valve controlling flush gas flow to the orifice to open approximately when it instructs another valve controlling reagent gas flow to the orifice to close;

wherein the flush gas valve is a shut-off valve; and wherein the flow of coating reagent from the coating reagent source continues uninterrupted when the valve controlling reagent gas flow to the orifice is closed.

* * * * *